US008021952B2

(12) United States Patent
Mueller et al.

(10) Patent No.: US 8,021,952 B2
(45) Date of Patent: Sep. 20, 2011

(54) INTEGRATED TRANSISTOR, PARTICULARLY FOR VOLTAGES AND METHOD FOR THE PRODUCTION THEREOF

(75) Inventors: Karlheinz Mueller, Velden (DE); Klaus Roeschlau, Grafing (DE)

(73) Assignee: Infineon Technologies AG, Munich (DE)

( * ) Notice: Subject to any disclaimer, the term of this patent is extended or adjusted under 35 U.S.C. 154(b) by 20 days.

(21) Appl. No.: 12/503,505

(22) Filed: Jul. 15, 2009

(65) Prior Publication Data

US 2009/0280616 A1 Nov. 12, 2009

Related U.S. Application Data

(60) Division of application No. 11/486,748, filed on Jul. 14, 2006, now Pat. No. 7,582,948, which is a continuation of application No. PCT/EP2004/053137, filed on Nov. 26, 2004.

(30) Foreign Application Priority Data

Jan. 15, 2004 (DE) .................. 10 2004 002 181

(51) Int. Cl.
*H01L 21/331* (2006.01)
(52) U.S. Cl. ........ 438/335; 438/357; 438/359; 257/511; 257/517
(58) Field of Classification Search .................. 438/335, 438/357–360; 257/511, 517, E21.384
See application file for complete search history.

(56) References Cited

U.S. PATENT DOCUMENTS

| 4,733,287 | A | 3/1988 | Bower |
|---|---|---|---|
| 5,206,182 | A | 4/1993 | Freeman |
| 5,340,753 | A | 8/1994 | Bassous et al. |
| 5,569,949 | A | 10/1996 | Malhi |
| 5,614,750 | A | 3/1997 | Ellul et al. |
| 5,661,329 | A | 8/1997 | Hiramoto et al. |
| 5,895,249 | A * | 4/1999 | Zambrano et al. ............ 438/356 |
| 5,912,501 | A | 6/1999 | Rynne et al. |
| 5,965,930 | A | 10/1999 | Sakamoto et al. |
| 6,011,297 | A | 1/2000 | Rynne |
| 6,420,771 | B2 | 7/2002 | Gregory |
| 6,831,346 | B1 * | 12/2004 | Li et al. ........................ 257/499 |
| 7,368,777 | B2 | 5/2008 | Kocon |
| 2001/0015470 | A1 | 8/2001 | Gregory |
| 2001/0020720 | A1 | 9/2001 | Hueting et al. |
| 2004/0145027 | A1 | 7/2004 | Nitta et al. |

FOREIGN PATENT DOCUMENTS

| EP | 0 068 072 A2 | 1/1983 |
|---|---|---|
| JP | 7-78833 A | 3/1995 |
| JP | 11-214398 | 8/1999 |
| WO | WO/2005/069280 | 7/2005 |

OTHER PUBLICATIONS

Japanese Office Action Dated Sep. 8, 2010 and English Translation.

* cited by examiner

*Primary Examiner* — Theresa T Doan
(74) *Attorney, Agent, or Firm* — Brinks Hofer Gilson & Lione

(57) ABSTRACT

Integrated transistor and method for the production is disclosed. An explanation is given of, inter alia, a transistor having an electrically insulating isolating trench extending from a main area in the direction of a connection region remote from the main area. Moreover, the transistor contains an auxiliary trench extending from the main area as far as the connection region remote from the main area. The transistor requires a small chip area and has outstanding electrical properties.

19 Claims, 5 Drawing Sheets

INTEGRATED TRANSISTOR, PARTICULARLY FOR VOLTAGES AND METHOD FOR THE PRODUCTION THEREOF

CROSS-REFERENCE TO RELATED APPLICATIONS

This application is a divisional of U.S. Ser. No. 11/486,748 filed Jul. 14, 2006, which is a continuation of international application PCT/EP2004/053137 filed Nov. 26, 2004, which claims priority to German Patent Application No. DE 102004002181.3 filed Jan. 15, 2004, all of which are incorporated in their entirety by reference herein.

FIELD OF THE INVENTION

The present invention relates to an integrated transistor and method for the production thereof.

BACKGROUND

Generally, bipolar transistors include connection regions referred to as the emitter region and base region. In a bipolar transistor, the reverse doping region is referred to as the base region. In field effect transistors, by contrast, the connection regions are referred to as the source region and drain region. In a field effect transistor, the reverse doping region serves for forming an inversion channel.

In so-called high-voltage transistors, a drift path is present in order to switch voltages of more than 40 volts, more than 50 volts or even more than 100 volts between the connection zones during normal operation.

A multiplicity of high-voltage transistors have been proposed heretofore whose electrical properties are improved by constructive measures, for example by field plates or by field rings. In particular, the breakdown voltage is increased or the chip area requirement is reduced by means of these measures. However, these transistors may have increased complexity with regard to design and manufacture.

SUMMARY

The invention relates to an integrated transistor having a semiconductor substrate, which is preferably monocrystalline or contains monocrystalline layers, a connection region remote from the main area and contained in the semiconductor substrate, said connection region being doped in accordance with a basic doping type and being arranged at a distance from a main area of the semiconductor substrate, a drift region contained in the semiconductor substrate, said drift region being doped in accordance with the basic doping type with a lower dopant concentration than the connection region remote from the main area, and said drift region being arranged between the connection region remote from the main area and the main area, a connection region near the main area, said connection region being doped in accordance with the basic doping type and being arranged, for example, at the main area of the substrate, a reverse doping region, which is doped in accordance with a different doping type than the basic doping type and separates the drift region from the connection region near the main area.

It is nevertheless one aspect of the invention that specifies an improved transistor which, in particular, is simple to produce, which, in particular, has outstanding electrical properties and which, in particular requires only a small chip area.

Moreover, a production method is specified by means of which a transistor can be produced in a simple manner.

The invention is based on the consideration that the number of trenches does not influence, or influences only slightly, the production outlay for an integrated circuit arrangement. Even different trench depths and different trench fillings can be produced with little outlay. Furthermore, the invention is based on the consideration that diffusion zones for the connection of the connection region remote from the main area easily exceed a lateral dimensioning of greater than 20 micrometers on account of the all-around diffusion in the case of high-voltage transistors. Trenches are particularly suitable for avoiding long diffusion paths or for laterally delimiting a deep diffusion. A further function which can be provided by trenches in a simple manner is the isolating function, which can likewise be used for reducing the chip area for a transistor. However, specific functions cannot be performed simultaneously by trenches, for example the connection function and the isolating function. Consequently, only double trenches or triple trenches per component are suitable for improving the electrical properties in conjunction with a small chip area.

In addition to the features mentioned in the introduction, therefore, a transistor in one embodiment of the invention has an electrically insulating isolating trench extending from the main area in the direction of the connection region remote from the main area and consequently having an isolating function, and an auxiliary trench extending from the main area as far as the connection region remote from the main area and serving for connection of the connection region remote from the main area, for example the auxiliary trench offers access for a doping material that diffuses into the surroundings of the trench, or the auxiliary trench forms the lateral boundary of a diffusion process.

In one development, the isolating trench and/or the auxiliary trench has at least one of the following features: a trench width greater than one micrometer or greater than two micrometers, so that a sufficient dielectric strength is provided in the case of an isolating trench, a trench width less than ten micrometers or less than five micrometers, so that an excessively large amount of chip area is not required for the trench, a trench depth greater than ten micrometers or greater than fifteen micrometers, a sufficient voltage drop across the drift path being achieved only through these depths.

In another development, the isolating trench contains an electrical isolation that completely fills the trench. As an alternative, the isolating trench contains an electrically insulating isolation on the trench walls and on the trench bottom and also an electrically conductive region in the trench. By way of example, deep trenches can be filled with doped polycrystalline silicon, with undoped silicon, with an oxide, or be filled with some other material.

In another development, the isolating trench has the same depth as the auxiliary trench, so that it is not necessary to take measures for producing different depths. As an alternative, the auxiliary trench is deeper than the isolating trench. By way of example, the isolating trenches are covered at the beginning or at the end of the etching of the auxiliary trenches, only one additional photolithographic step being required, for example.

In a development with different trench depths, the distance between the bottom of the isolating trench and the connection region remote from the main area is in the range of ⅕ to ⅘ or in the range of ⅓ to ⅔ relative to the distance between the main area and the connection region remote from the main area. If, in the same depth as the already mentioned connection region remote from the main area, a further connection region remote from the main area is present, as far as which a further isolating trench extends, which has the same depth as the auxiliary trench, then an ESD protection element (electrostatic discharge) can be produced in the region of the shortened isolating trench in a simple manner, said protection element avoiding damage to the other component by means of its own early breakdown.

In another development, the auxiliary trench has the same trench filling as the isolating trench. Consequently, measures for introducing different trench fillings are not necessary. In an alternative configuration, by contrast, the auxiliary trench has a different trench filling than the isolating trench. In particular, the auxiliary trench is filled with an electrically conductive material, e.g. with doped polycrystalline silicon or with a metal, which is electrically conductively connected to the connection region remote from the main area. Different trench fillings can be achieved in a simple manner by the covering or the later formation of the other type of trench.

In a next development, a doping of the basic doping type with a higher dopant concentration than in the drift region is present between the isolating trench and the auxiliary trench, the doping filling the region between the isolating trench and the auxiliary trench completely—for example in the case of a vertical diffusion delimited by the two trenches—or only in the vicinity of the auxiliary trench and not in the vicinity of the isolating trench—for example in the case of a diffusion proceeding from the auxiliary trench.

In another development, the auxiliary trench is electrically insulating. The auxiliary trench extends into the substrate main region more deeply than the connection region remote from the main area and is arranged at the edge of an electronic component, so that it insulates the component from other components into the depth as well.

In a next development, a substrate main region is doped in accordance with the reverse doping type. A substrate trench extends from the main area as far as the substrate main region and serves for connection of the substrate main region. Consequently, three types of trench are present, namely the isolating trench, the auxiliary trench and the substrate trench. The substrate trench enables a simple and area-saving connection of the substrate, for example as access for a doping material that is introduced into the surroundings of the substrate trench, or as a lateral boundary of a diffusion process.

The technical effects discussed above for the auxiliary trench and the isolating trench also apply to the formation of the substrate trench, in particular with regard to the same depth of trenches and with regard to the same trench filling of trenches.

In a next development, a connection of the transistor is electrically conductively connected to the reverse doping region, so that the transistor is a bipolar transistor having a pnp layer sequence or an npn layer sequence. As an alternative, an insulating layer is present that is electrically insulating, adjoins the reverse doping region and isolates the reverse doping region from an electrically conductive control electrode of the transistor, so that a field effect transistor is formed which operates as an n-channel transistor or as a p-channel transistor.

The invention additionally relates to a method having the steps specified in the independent or coordinate method claim, the order in which the steps are specified not constituting any restriction. In the case of the method, similarly, a transistor with a multiple trench arises, so that the technical effects specified above also apply to the method.

Further objects, features and advantages of this invention will become readily apparent to persons skilled in the art after a review of the following description, with reference to the drawings and claims that are appended to and form a part of this specification.

DETAILED DESCRIPTION

Exemplary embodiments are explained below which apply in principle both to bipolar transistors and to field effect transistors. In the exemplary embodiments, only one emitter or source connection and one base or gate connection are provided per component. In order to increase the switching current, other exemplary embodiments use, in one component, a sequence of emitter-base pairs which are respectively assigned a collector region, or source-gate pairs which are respectively assigned a drain region. By way of example, the collector or drain connection and/or the substrate connection encloses the emitter-base pairs or the source-gate pairs, respectively, of a component.

Figure 1:
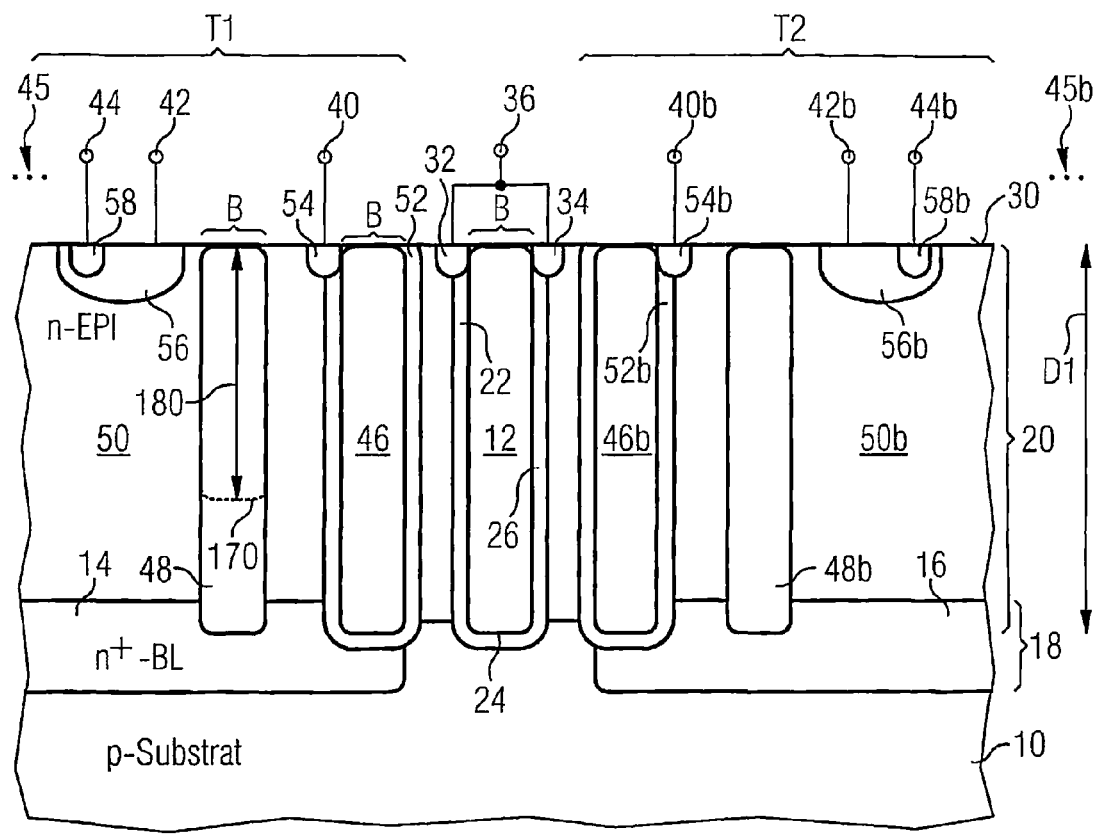
FIG. 1 shows two bipolar transistors each having two trenches, a substrate connection being produced with the aid of a substrate trench.

FIG. 1 shows two bipolar transistors T1 and T2, a substrate connection of a substrate main part 10 being produced with the aid of a substrate trench 12. The substrate main part 10 contains lightly p-doped silicon and is contained in a commercially available wafer, by way of example. Buried doping regions 14 and 16 have been introduced into the wafer, said doping regions being heavily n-doped and belonging to a buried layer 18. A lightly n-doped epitaxial layer 20 has a layer thickness D1 of twenty micrometers in the exemplary embodiment. The epitaxial layer 20 is adjacent to the substrate main area 10 and contains an upper layer part of the buried layer 18.

The substrate trench 12 penetrates through the epitaxial layer 20 and ends in the substrate main part 10. The substrate trench 12 is surrounded at its sidewalls 22 and at the trench bottom 24 by a substrate connection doping 26, e.g. a high p-type doping, which surrounds the substrate trench 12 with a layer thickness of e.g. greater than 500 nanometers or of one micrometer. In particular, the layer thickness of the substrate connection doping 26 is less than three micrometers.

Heavily p-doped doping regions 32 and 34 extend from the surface 30 of the epitaxial layer 20 on both sides of the substrate trench 12, said doping regions being electrically conductively connected to a metallic or polycrystalline substrate connection 36. The doping regions 32 and 34 in each case have e.g. a depth of one micrometer and a width of one micrometer.

The two transistors T1 and T2 lie e.g. on both sides of the substrate trench 12. The transistor T1 contains a collector connection 40, a base connection 42, and an emitter connection 44.

In another exemplary embodiment, further base connection-emitter connection pairs 45 of the transistor T1 are present, indicated by dots. The collector connection 40, the base connection 42 and the emitter connection 44 are electrically conductive and contain e.g. a metal or highly doped polycrystalline silicon.

In the transistor T1, there is an auxiliary trench 46. The auxiliary trench 46 encloses an isolating trench 48, which laterally isolates a drift zone 50 formed in the epitaxial layer 20.

The auxiliary trench 46 penetrates through the epitaxial layer 20 and ends in the doping region 14 of the buried layer 18. The auxiliary trench 46 is surrounded at its sidewalls and at the trench bottom by a collector connection doping 52, for example a high n-type doping, which surrounds the auxiliary trench 46 with a layer thickness of e.g. 500 nanometers or of one micrometer. In particular, the layer thickness of the collector connection doping 52 is less than three micrometers.

A heavily n-doped doping region 54 extends from the surface 30 of the epitaxial layer 20 at the inner trench edge of the substrate trench 12, said doping region being electrically conductively connected to the collector connection 40. The doping region 54 has e.g. a depth of one micrometer and a width of e.g. greater than three micrometers, e.g. five micrometers. In another exemplary embodiment, there are doping regions for the collector connection 40 on both sides of the auxiliary trench 46 along the peripheral trench edge. As an alternative, there is only one outer doping region for the collector connection 40 on the right-hand side of the auxiliary trench 46 relative to the trench section illustrated in FIG. 1.

A region of the epitaxial layer 20 lies between the substrate connection doping 26 and the collector connection doping 52. By way of example, the minimum distance between the substrate connection doping 26 and the collector connection doping 52 is greater than ten micrometers, e.g. twenty micrometers.

The isolating trench 48 likewise penetrates through the epitaxial layer 20 and ends in the doping region 14 of the buried layer 18. The isolating trench 48 is not surrounded by a doping region introduced with the aid of the isolating trench 48.

A p-doped base region 56 extends from the surface 30 of the epitaxial layer 20 within the zone enclosed by the isolating trench 48, said base region being electrically conductively connected to the base connection 42. The base region 56 has e.g. a depth in the range of one micrometer up to three micrometers, e.g. of two micrometers, and a width of e.g. greater than four micrometers, e.g. ten micrometers.

The base region 56 encloses an n-doped emitter region 58, which likewise extends from the surface 30 of the epitaxial layer 20 in the direction of the doping region 14. The emitter region 58 is electrically conductively connected to the emitter connection 44.

In the exemplary embodiment, the substrate trench 12, the auxiliary trench 46 and the isolating trench 48 are completely filled with an electrically insulating material, namely with silicon dioxide. In the exemplary embodiment, the trench width B of the substrate trench 12, of the auxiliary trench 46 and of the isolating trench 48 is 1.5 micrometers in each case. The trench depth is identical for all three trenches 12, 46 and 48 and is 21 micrometers, by way of example.

The transistor T2 is constructed like the transistor T1, so that reference is made to the explanations above. Elements of the transistor T2 having the same construction and the same function as elements in the transistor T1 bear the same reference symbol in FIG. 1, but followed by the lower-case letter b, see e.g. a base region 56b corresponding to the base region 56, an auxiliary trench 46b and an isolating trench 48b.

Figure 2:
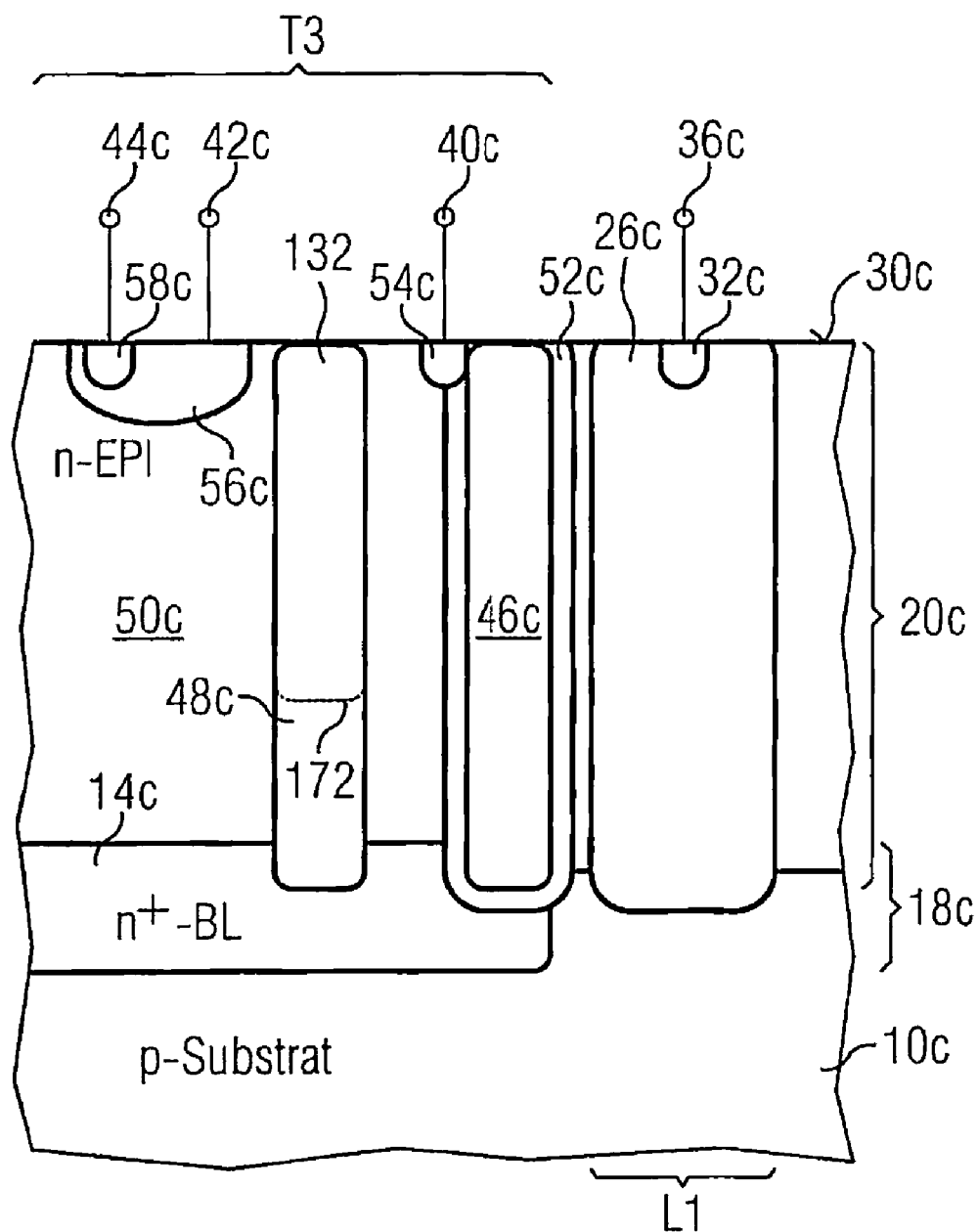
FIG. 2 shows a bipolar transistor having two trenches, a substrate connection being produced by means of a large-area diffusion.

By virtue of the construction of the transistors T1 and T2 that is illustrated in FIG. 1, only a small chip area is required because the connection of the doping region 14 and 16 via the collector connection doping 52 and 52b, respectively, lies very near to the base region 56 and 56b, respectively, on account of the isolating trench 48 and 48b, respectively. FIG. 2 shows a bipolar transistor T3, which is constructed like the bipolar transistor T1 apart from the deviations explained below, so that like elements are designated by the same reference symbols but followed by the lower-case letter c, see:
Substrate main region 10c,
Doping region 14c in a buried layer 18c,
Epitaxial layer 20c,
Surface 30c,
Collector connection 40c,
Base connection 42c,
Emitter connection 44c,
Auxiliary trench 46c,
Isolating trench 48c,
Drift region 50c,
Collector connection doping 52c,
Doping region 54c,
Base region 56c, and
Emitter region 58c.

In the case of the bipolar transistor T3, in contrast to the transistor T1 and T2, the substrate connection was produced by means of a high p-type doping and a subsequent large-area diffusion in relation to the required chip area as far as the substrate main part 10c. A smallest lateral dimensioning L1 of a substrate connection doping 26c is approximately equal to the diffusion depth at the surface 30c, that is to say that the dimensioning L1 is more than twenty micrometers in the exemplary embodiment. The required chip area is nevertheless smaller than in the case of previously known transistors on account of the use of the trenches 46c and 48c. Moreover, the large-area substrate connection does not have to be embodied separately for each transistor.

The substrate connection doping 26c is electrically conductively connected via a p-type doping region 32c to a substrate connection 36c corresponding to the substrate connection 36. The substrate connection doping 26c is again separated from the collector connection doping 52c by a zone of the epitaxial layer 20c in which the original dopant concentration of the epitaxial layer is present.

Figure 3:
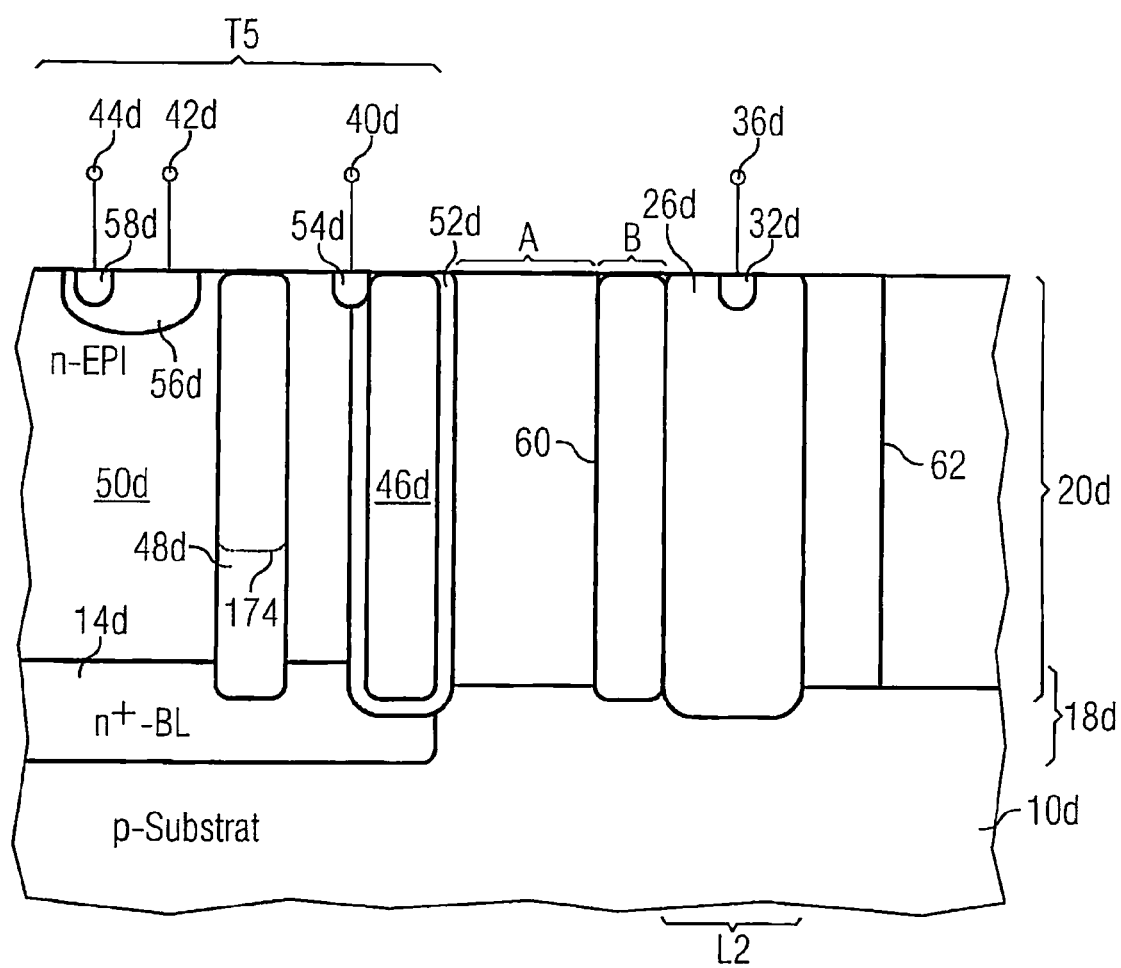
FIG. 3 shows a bipolar transistor having two trenches, a substrate connection being delimited by two substrate trenches.

FIG. 3 shows a bipolar transistor T5, which is constructed like the bipolar transistor T1 apart from the deviations explained below, so that identical elements are designated by the same reference symbols but followed by the lower-case letter d, see:
Substrate main region 10d,
Doping region 14d in a buried layer 18d,
Epitaxial layer 20d,
Surface 30d,
Collector connection 40d,
Base connection 42d,
Emitter connection 44d,
Auxiliary trench 46d,
Isolating trench 48d,
Drift region 50d,
Collector connection doping 52d,
Doping region 54d,
Base region 56d, and
Emitter region 58d.

In the case of the bipolar transistor T5, in contrast to the transistors T1, T2 and T3, a substrate connection doping 26d was produced by a diffusion that was laterally delimited by two substrate trenches 60 and 62. The substrate trenches 60 and 62 have the width B, that is to say the same width as the auxiliary trench 46d and the isolating trench 48d. The depth of the substrate trenches 60, 62 also matches the depth of the auxiliary trench 46d and the isolating trench 48d, that is to say that the depth is 21 micrometers in the exemplary embodiment. The substrate trenches 60 and 62 contain the same filling material as the auxiliary trench 46d and the isolating trench 48d.

Although the substrate connection doping 26d has been outdiffused into the depth over ten micrometers as far as the substrate main region 10d, the smallest lateral dimensioning L2 or the width of the substrate connection doping 26d is less than five micrometers. The lateral dimensioning L2 is prescribed by the distance between the walls of the substrate trenches 60 and 62 bearing against the substrate connection doping 26d and is three micrometers in the exemplary embodiment.

The substrate connection doping 26d is electrically conductively connected via a p-doped doping region 32d to a substrate connection 36d corresponding to the substrate connection 36. A region in which the original doping of the epitaxial layer 20d is retained lies between that wall of the substrate trench 60 which faces the auxiliary trench 46d and the collector connection doping region 52d. By way of example, a distance A between the collector connection doping region 52d and the trench wall of the substrate trench 60 is less than five micrometers, one micrometer in the exemplary embodiment.

The connection variant of the substrate main region 10d illustrated in FIG. 3 is thus space-saving and has very low impedance. On account of the good connection of the substrate main region 10d, the high-voltage transistor T5 also has good switching properties.

Figure 4:
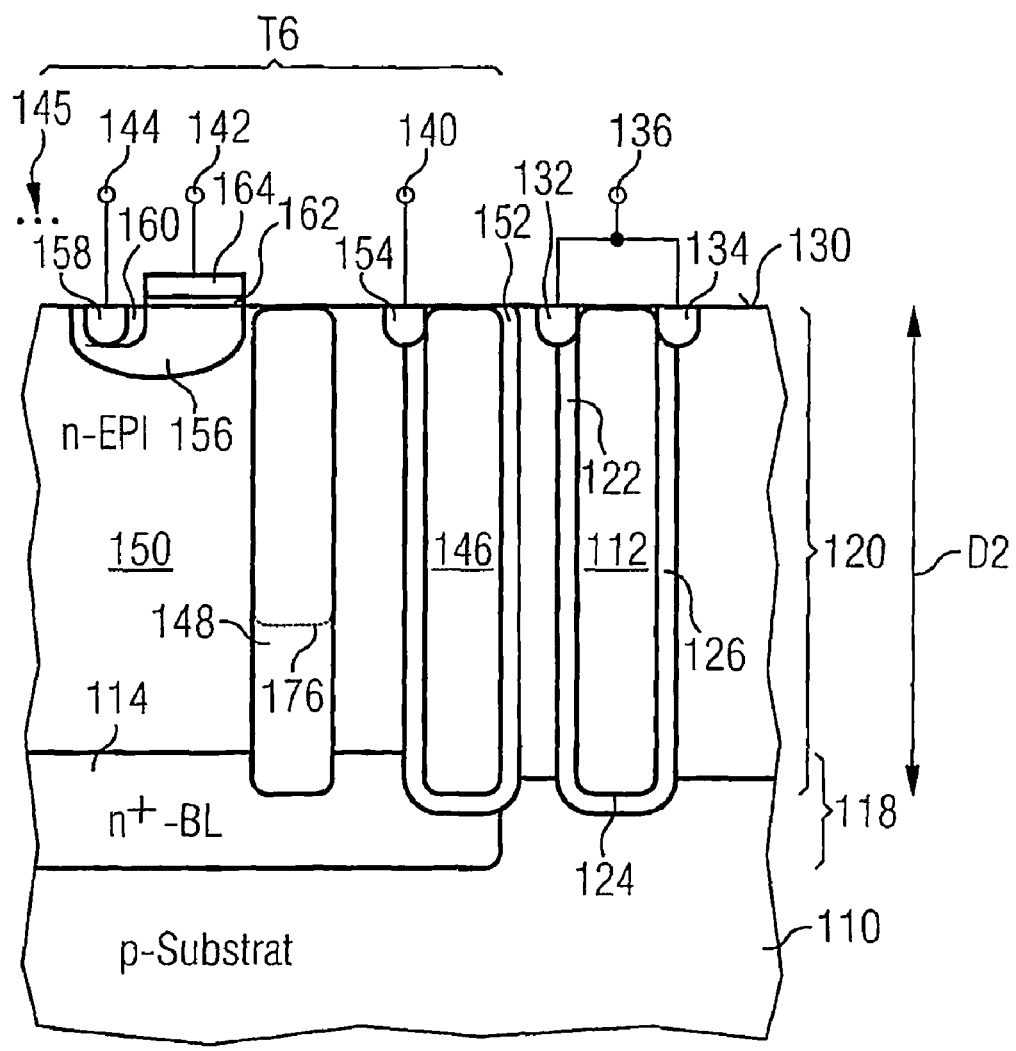
FIG. 4 shows a field effect transistor having two trenches.

FIG. 4 shows a field effect transistor T6, a substrate connection of a substrate main part 110 being produced with the aid of a substrate trench 112. The substrate main part 110 contains lightly p-doped silicon and is originally contained in a commercially available wafer, by way of example. Doping regions have been introduced into the wafer, e.g. a doping region 114, said doping regions being heavily n-doped and belonging to a buried layer 118. In the exemplary embodiment, a lightly n-doped epitaxial layer 120 has a layer thickness D2 of twenty micrometers. The epitaxial layer 120 is adjacent to the substrate main region 110 and contains an upper layer part of the buried layer 118.

The substrate main region 110 is connected like the substrate main region 10, that is to say by the substrate trench 112, which is formed like the substrate trench 12, a substrate connection doping 126 corresponding to the substrate connection doping 26, heavily p-doped doping regions 132 and 134 corresponding to the doping regions 32 and 34, respectively, and by a substrate connection 136 having the same construction and the same function as the substrate connection 36.

The transistor T6 contains a drain connection 40, a gate connection 42, and a source connection 44.

The drain connection 40, the gate connection 42 and the source connection 44 are electrically conductive and contain e.g. a metal of highly doped polycrystalline silicon.

In the transistor T6, there is an auxiliary trench 146 enclosed by the substrate trench 112, for example. The auxiliary trench 146, for its part, encloses an isolating trench 148, which laterally isolates a drift zone 150 formed in the epitaxial layer 120.

The buried doping region 114 is connected like the doping region 14, that is to say by the auxiliary trench 146, which is formed like the auxiliary trench 46, a drain connection doping 152 corresponding to the collector connection doping 52, and a heavily n-doped doping region 154, which is formed like the doping region 54.

A region of the epitaxial layer 120 lies between the substrate connection doping 126 and the drain connection doping 152. By way of example, the minimum distance between the substrate connection doping 126 and the drain connection doping 152 is greater than ten micrometers, typically equal to the thickness of the epitaxial layer 120.

The isolating trench 148 likewise penetrates through the epitaxial layer 120 and ends in the doping region 114 of the buried layer 118. The isolating trench 148 is not surrounded by a doping region introduced with the aid of the isolating trench 148, but rather directly adjoins the epitaxial layer 120.

A p-doped channel doping region 156 extends from the surface 130 of the epitaxial layer 120 within the zone enclosed by the isolating trench 148, said channel doping region serving for forming an inversion channel. The channel doping region 156 has e.g. a depth in the range of one micrometer up to three micrometers, e.g. of two micrometers, and a width greater than four micrometers, e.g. ten micrometers.

The channel doping region 156 encloses an n-doped source region 158 which likewise extends from the surface 130 of the epitaxial layer 120 in the direction of the buried doping region 114. The source region 158 is electrically conductively connected to the source connection 144. A lightly n-doped extension region 160 of the source region 158 is optionally situated between the channel doping region 156 and the source region 160.

A dielectric 162 made of silicon dioxide, for example, is situated on the surface of the channel doping region 156 that lies between the source region 158 and the isolating trench 148. The thickness of the dielectric 162 is more than 10 nanometers, in particular 15 nanometers. A gate region 164 made e.g. of a metal or highly doped polycrystalline silicon is arranged on that side of the dielectric 162 which is remote from the epitaxial layer 120. The gate region 164 is electrically conductively connected to the gate connection 142.

In the exemplary embodiment, the substrate trench 112, the auxiliary trench 146 and the isolating trench 148 are completely filled with electrically insulating material, namely with silicon dioxide. In the exemplary embodiment, the trench width B of the substrate trench 112, of the auxiliary trench 146 and of the isolating trench 148 is 1.5 micrometers in each case. The trench depth is identical for all three trenches 112, 146 and 148 and is 21 micrometers, by way of example.

The field effect transistor T6 is a field effect transistor in which the channel length is determined by the dimensions of the gate. In an alternative exemplary embodiment, the field effect transistor T6 is a doubly diffused field effect transistor in which the channel length is set by way of a diffusion length. The field effect transistor T6 can also be produced on a small chip area and is nevertheless suitable for switching voltages of greater than 40 volts, greater than 50 volts or even greater than 100 volts.

Figure 5:
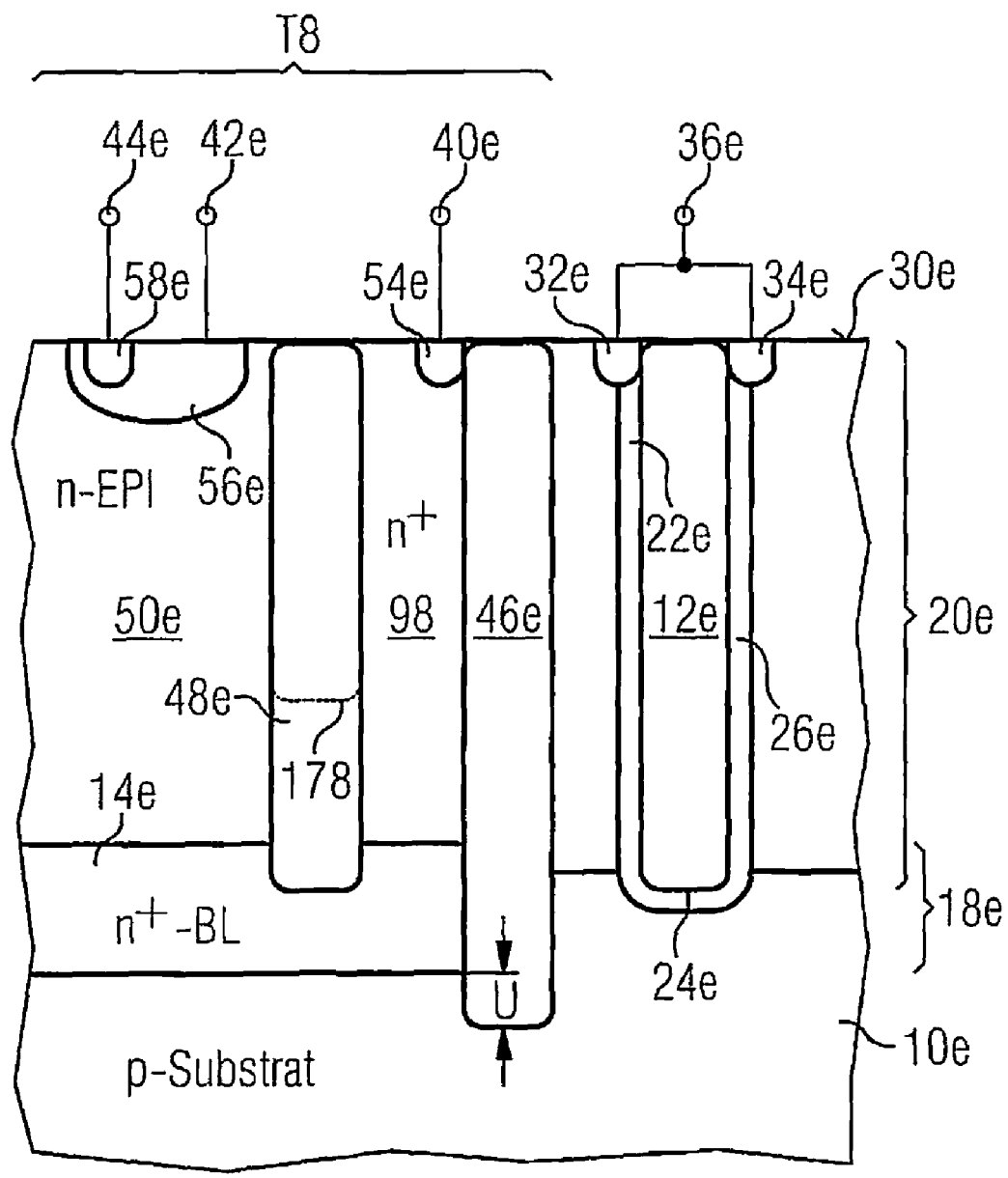
FIG. 5 shows a bipolar transistor having two trenches with different lengths.

FIG. 5 shows a bipolar transistor T8, which is constructed like the bipolar transistor T1 apart from the deviations explained below, so that identical elements are designated by the same reference symbols but followed by the lower-case letter e, see:

Substrate main region 10e,
Doping region 14e in a buried layer 18e,
Epitaxial layer 20e,
Surface 30e,
Collector connection 40e, Base connection 42e,
Emitter connection 44e,
Auxiliary trench 46e,
Isolating trench 48e,
Drift region 50e,
Doping region 54e,
Base region 56e, and
Emitter region 58e.

The substrate trench 12e and the isolating trench 48e have the same depth of e.g. 21 micrometers. By contrast, the auxiliary trench 46e is made deeper, e.g. by more than three micrometers, in comparison with the substrate trench 12e or isolating trench 48e. The trench bottom of the auxiliary trench 52e is situated more deeply than that interface of the doping region 14e which is furthest away from the surface 30e, for example by more than one micrometer, see overhang dimension U.

The auxiliary trench 46e preferably adjoins the doping region 14e. The auxiliary trench 46e is preferably arranged in such a way that the doping region 14e is completely enclosed laterally by the auxiliary trench 46e. In another exemplary embodiment, the auxiliary trench 46e subdivides the doping region 14e into an inner region, which is electrically conductively connected to the collector connection 40e, and into an outer doping region, which is electrically insulated from the inner doping region and does not belong to a component.

The auxiliary trench 46e is not surrounded by a doping region introduced with the aid of the auxiliary trench 46e. A trench intermediate region 98 between the auxiliary trench 46e and the isolating trench 48e was heavily n-doped in its entirety, for example by an implantation with subsequent outdiffusion. The distance between the auxiliary trench 46e and the isolating trench 48e is e.g. less than five micrometers or even less than three micrometers. Despite a diffusion depth of more than ten micrometers, the lateral diffusion during the doping of the trench intermediate region 98 is effectively delimited by the auxiliary trench 46e and the isolating trench 48e, thereby likewise giving rise to a transistor which requires only a small chip area and is nevertheless suitable for switching voltages of greater than 40 volts.

In other exemplary embodiments, the isolating trench 48, 48c, 48d, 148 or 48e is embodied in a shortened manner, so that it does not reach as far as the buried doping region 14, 14c, 14d, 114 or 14e, respectively, see dashed lines 170 to 178. By way of example, the distance between the trench bottom of the isolating trench and the buried doping region is greater than one micrometer or greater than three micrometers. The breakdown voltage $U_{CE}$ of the transistor T1, T3, T5, T8 or the breakdown voltage $U_{DS}$ of the transistor T6 is thereby reduced. By way of example, the transistor T1, given a shortened isolating trench 48, can be used as an ESD protection element for the transistor T2 with an unshortened isolating trench 48b if the isolating trench 48b has the depth illustrated in FIG. 1, that is to say reaches as far as the buried doping region 16. The breakdown voltage of the ESD protection element can be set by way of the distance between the trench bottom of the isolating trench 48 and the surface 30, see arrow 180 in FIG. 1. Particularly in the case of a bipolar transistor, an ESD protection effect can be achieved even if, in the transistor to be protected, the isolating trench is shortened only in one section.

In other exemplary embodiments, field effect transistors constructed like the field effect transistor T6 are used instead of the bipolar transistors T1, T2, T3, T5 and T8 elucidated in FIGS. 1, 2, 3 and 5.

To summarize, it holds true that a vertical drift path that saves chip area arises as a result of the introduction of the isolating trench. The drift path runs firstly into the depth along the isolating trench and then on the other side of the isolating trench vertically to the surface along the isolating trench. The required chip area can thereby be drastically reduced compared with transistors with a lateral drift path.

Moreover, the possibility is afforded of setting, by way of the depth of the trench, the collector-emitter breakdown voltage $U_{CE}$ in the case of bipolar transistors or the drain-source breakdown voltage $U_{DS}$ in the case of MOS transistors (metal oxide semiconductor) in a targeted manner in conjunction with laterally unchanged dimensions.

The doping of the trench walls for the collector connection or drain connection and also for the substrate connection may be effected e.g. by implantation with subsequent outdiffusion or by coating. The trenches are etched e.g. by means of a trench etching process, e.g. in dry-chemical fashion.

The isolating trench, the auxiliary trench and, if appropriate, also the substrate trench are produced simultaneously in one exemplary embodiment. Different depths can also be achieved during simultaneous etching if different trench widths are chosen. At least one of the following steps is also performed simultaneously and thus in a simple manner: filling of the trenches of the two or three types of trench, doping of the sidewalls of an auxiliary trench and of a substrate trench.

As a person skilled in the art will readily appreciate, the above description is meant as an illustration of implementation of the principles this invention. This description is not intended to limit the scope or application of this invention in that the invention is susceptible to modification, variation and change, without departing from the spirit of this invention, as defined in the following claims.

We claim:

1. A method for the production of a transistor comprising:
   forming a first connection region remote from a main area in a semiconductor substrate main region, the first connection region being doped in accordance with a basic doping type and being arranged at a distance from a main area of the semiconductor substrate;
   forming a drift region, which is doped in accordance with the basic doping type with a lower dopant concentration than the first connection region and is arranged between the first connection region and the main area;
   forming a second connection region near the main area, the second connection region being doped in accordance with the basic doping type and being arranged nearer to the main area of the substrate than the first connection region;
   forming a reverse doping region, which is doped in accordance with a different doping type than the basic doping type and separates the drift region from the second connection region;
   forming an electrically insulating isolating trench extending from the main area in the direction of the first connection region; and
   forming an auxiliary trench extending from the main area as far as the connection region remote from the main area;
   wherein a doping of the basic doping type with a higher dopant concentration than in the drift region is arranged between the isolating trench and the auxiliary trench, the doping filling only a region in a vicinity of the auxiliary trench and not in a vicinity of the isolating trench.

2. The method as claimed in claim 1, further comprising:
   forming an epitaxial layer accommodating the drift region on the substrate main region after the introduction of the doping for the connection region near the main area;

forming the connection region near the main area or of the reverse doping region after the formation of the drift region; and forming the isolating trench and of the auxiliary trench after the formation of the drift region.

3. The method as claimed in claim 1, further comprising:
forming at least one substrate trench extending from the main area as far as the substrate main region.

4. The method as claimed in claim 1, further comprising:
defining the position of the isolating trench and of the auxiliary trench or the position of the isolating trench, of the auxiliary trench and of the substrate trench by means of the same photolithographic method by means of only one exposure.

5. The method as claimed in claim 1, further comprising:
introducing a doped material into the auxiliary trench and/or into the substrate trench;
outdiffusing the doped material into the trench wall; and
removing the introduced material after outdiffusing.

6. The method as claimed in claim 1, wherein the isolating trench contains an electrical isolation that completely fills the isolating trench.

7. The method as claimed in claim 1, wherein the isolating trench contains an electrically insulating isolation on at least one trench wall and on the trench bottom and also an electrically conductive region in the trench.

8. The method as claimed in claim 1, wherein the isolating trench has the same depth as the auxiliary trench.

9. The method as claimed in claim 1, wherein the auxiliary trench is deeper than the isolating trench.

10. The method as claimed in claim 9, wherein at least in a section of the isolating trench, the distance between the bottom of the isolating trench and the first connection region is in the range of $1/5$ to $4/5$ relative to the distance between the main area and the first connection region remote.

11. The method as claimed in claim 10, wherein another section of the isolating trench extends as far as the first connection region.

12. The method as claimed in claim 9, wherein a further connection region remote from the main area is present, as far as which a further isolating trench extends, which has the same depth as the auxiliary trench.

13. The method as claimed in claim 1, wherein the auxiliary trench contains the same trench filling as the isolating trench.

14. The method as claimed in claim 1, wherein a doping of the basic doping type with a higher dopant concentration than in the drift region is arranged between the isolating trench and the auxiliary trench, the doping extending from the edge of the isolating trench as far as the edge of the auxiliary trench.

15. The method as claimed in claim 1, wherein the auxiliary trench is electrically insulating, and in that the bottom of the auxiliary trench is situated more deeply than the first connection region, and in that the auxiliary trench is preferably arranged at the edge of an electronic component, in particular of a transistor.

16. The method as claimed in claim 1, further comprising forming a substrate main region doped in accordance with the reverse doping type; and
at least one substrate trench extending from the main area as far as the substrate main region.

17. The method as claimed in claim 16, wherein the substrate trench is surrounded by a doping region with a doping in accordance with the reverse doping type and with a higher dopant concentration than in the substrate main region.

18. The method as claimed in claim 16, wherein at least two substrate trenches are formed, a doping region with a doping in accordance with the reverse doping type and with a higher dopant concentration than in the substrate main region extending from a trench edge of a first substrate trench of the at least two substrate trenches to a trench edge of a second substrate trench of the at least two substrate trenches.

19. A method for the production of a transistor comprising:
forming a first connection region remote from a main area in a semiconductor substrate main region, the first connection region being doped in accordance with a basic doping type and being arranged at a distance from a main area of the semiconductor substrate;

forming a drift region, which is doped in accordance with the basic doping type with a lower dopant concentration than the first connection region and is arranged between the first connection region and the main area;

forming a second connection region near the main area, the second connection region being doped in accordance with the basic doping type and being arranged nearer to the main area of the substrate than the first connection region;

forming a reverse doping region, which is doped in accordance with a different doping type than the basic doping type and separates the drift region from the second connection region;

forming an electrically insulating isolating trench extending from the main area in the direction of the first connection region, wherein the drift region extends from the first connection region to the reverse doping region; and forming an auxiliary trench extending from the main area as far as the connection region remote from the main area.

\* \* \* \* \*